(12) United States Patent
Hao et al.

(10) Patent No.: US 12,739,041 B2
(45) Date of Patent: Sep. 15, 2026

(54) ON-CHIP TEST TONE GENERATOR FOR BUILT-IN SPUR TESTING

(71) Applicant: Qualcomm Incorporated, San Diego, CA (US)

(72) Inventors: Shilei Hao, San Diego, CA (US); Dongling Pan, San Diego, CA (US); Rui Xu, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 357 days.

(21) Appl. No.: 18/337,256

(22) Filed: Jun. 19, 2023

(65) Prior Publication Data

US 2024/0421918 A1 Dec. 19, 2024

(51) Int. Cl.
*H04B 17/00* (2015.01)
*H03L 7/099* (2006.01)

(52) U.S. Cl.
CPC ....... *H04B 17/0085* (2013.01); *H03L 7/0995* (2013.01)

(58) Field of Classification Search
CPC ...... H04B 17/0085; H04B 1/40; H04B 17/17; H04B 17/18; H04B 17/19; H03L 7/0995
See application file for complete search history.

(56) References Cited

U.S. PATENT DOCUMENTS

2001/0027503 A1* 10/2001 Yamato ..................... G06F 1/08 710/305
2005/0018581 A1* 1/2005 Ishii ..................... G10H 1/0066 369/59.24
2007/0026809 A1 2/2007 Zhang et al.
2016/0204881 A1* 7/2016 Chung ................... H04B 17/19 455/67.14
2019/0097739 A1* 3/2019 Melester ................ H04B 1/006
2022/0050162 A1* 2/2022 Zand ..................... H04W 4/023

FOREIGN PATENT DOCUMENTS

WO 2015175138 A1 11/2015

OTHER PUBLICATIONS

International Search Report and Written Opinion—PCT/US2024/029156—ISA/EPO—Aug. 26, 2024, 10 pages.

* cited by examiner

*Primary Examiner* — Phung-Hoang J Nguyen
(74) *Attorney, Agent, or Firm* — Loza & Loza LLP

(57) ABSTRACT

An apparatus is disclosed that implements an on-chip test tone generator for built-in spur testing. In an example aspect, the apparatus includes an integrated circuit with a test tone generator, at least one reference signal generator, and at least one signal propagation path. The test tone generator includes an amplitude control circuit. The at least one signal propagation path includes a transceiver path, a mixer, and a switch. The transceiver path is configured to be coupled to an antenna. The mixer has a first input coupled to the at least one reference signal generator. The switch is configured to selectively couple a second input of the mixer to the transceiver path or the amplitude control circuit of the at least one test tone generator.

19 Claims, 12 Drawing Sheets

FIG. 1

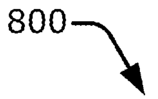
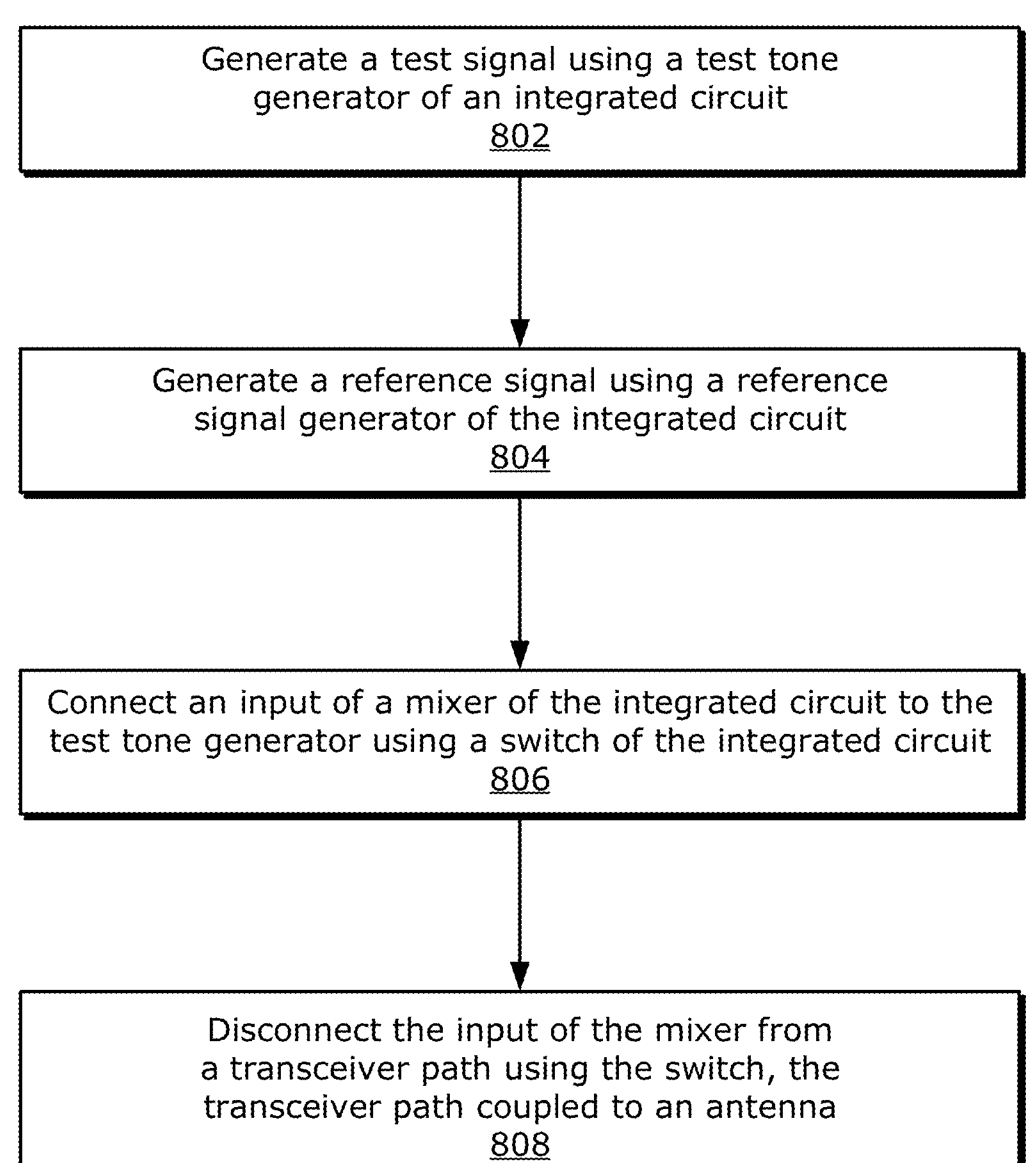
FIG. 8

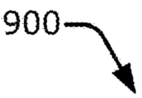

Select a frequency difference between a first phase-locked loop of a first reference signal generator and a second phase-locked loop of a second reference signal generator
902

Tune a frequency generated by the second phase-locked loop based on a frequency generated by the first phase-locked loop and the selected frequency difference
904

Tune a frequency generated by a test tone generator such that a first spurious signal can be measured at a frequency that is equal to a combination of a reference frequency generated by the second reference signal generator based on the frequency generated by the second phase-locked loop and an absolute value of the selected frequency difference
906

Tune the frequency generated by the test tone generator such that a second spurious signal can be measured at a frequency that is equal to a combination of the reference frequency generated by the second reference signal generator and an absolute value of a difference between the reference frequency generated by the second reference signal generator and a reference frequency generated by the first reference signal generator based on the frequency generated by the first phase-locked loop
908

FIG. 9

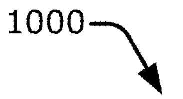

Deactivate a frequency-tuning circuit of a first reference signal generator
1002

Configure the first reference signal generator, a second reference signal generator, and a test tone generator to enable measurement of a spurious signal
1004

Change a voltage-controlled oscillator of the first reference signal generator to a different voltage-controlled oscillator associated with a different oscillator type
1006

Configure the first reference signal generator, the second reference signal generator, and the test tone generator to enable measurement of the spurious signal
1008

FIG. 10

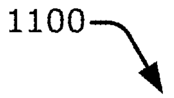

Activate a first reference signal generator that is a first distance away from a second reference signal generator
1102

Configure the first reference signal generator, the second reference signal generator, and a test tone generator to enable measurement of a spurious signal
1104

Activate a third reference signal generator that is a second distance away from the second reference signal generator, the second distance being different that the first distance
1106

Configure a third reference signal generator, the second reference signal generator, and the test tone generator to enable measurement of the spurious signal
1108

FIG. 11

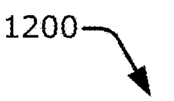
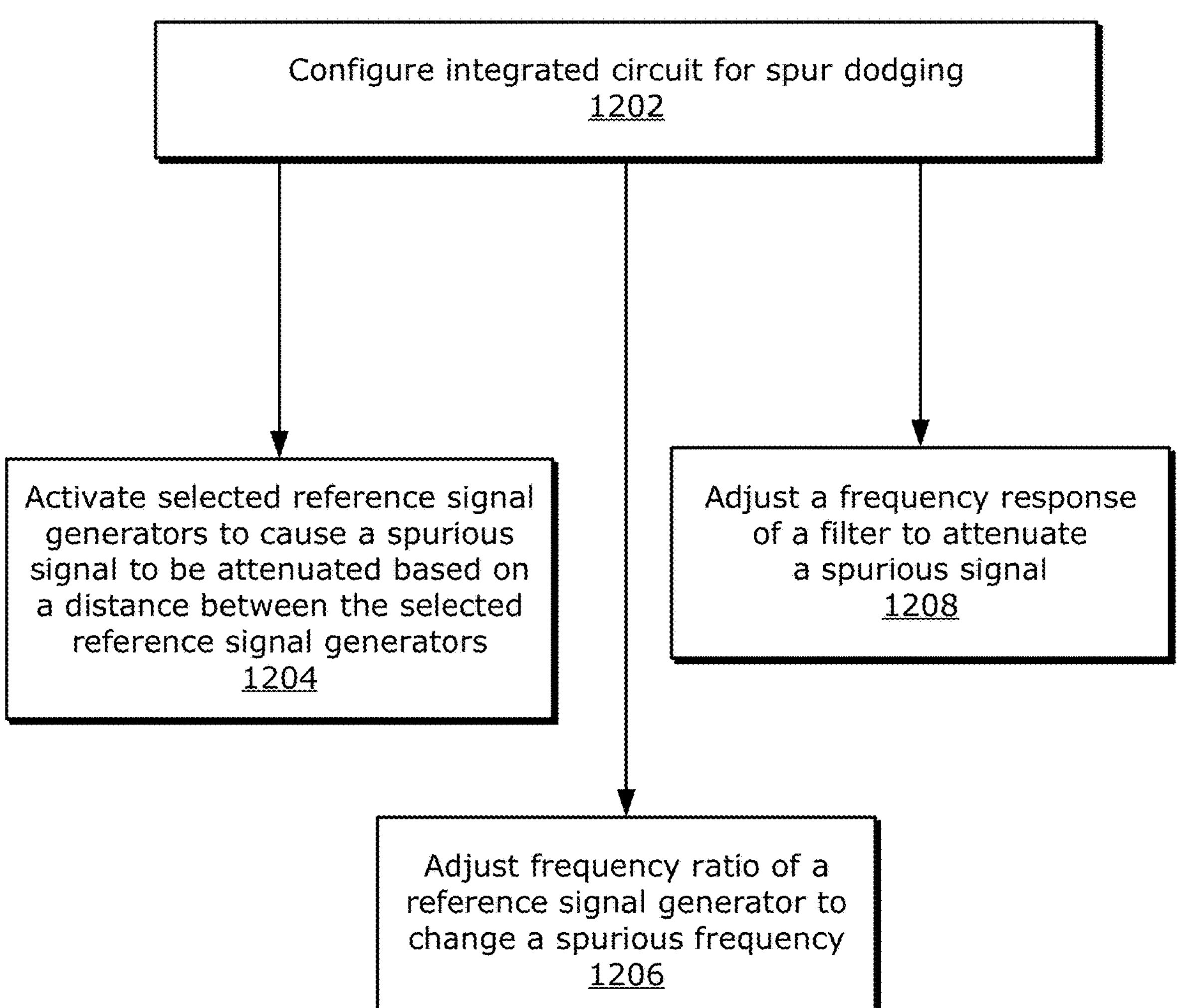
FIG. 12

ON-CHIP TEST TONE GENERATOR FOR BUILT-IN SPUR TESTING

TECHNICAL FIELD

This disclosure relates generally to wireless transceivers and, more specifically, to an on-chip test tone generator for built-in spur testing.

BACKGROUND

Electronic devices use radio-frequency (RF) signals to communicate information. These radio-frequency signals enable users to talk with friends, upload or download information, share pictures, remotely control household devices, receive global positioning information, and so forth. Some electronic devices may include a wireless transceiver with multiple signal propagation paths. These signal propagation paths can process communication signals associated with different frequency bands to support techniques such as carrier aggregation. Self-generated interference, however, can make it challenging to enable concurrent operation of these multiple signal propagation paths.

SUMMARY

An apparatus is disclosed that implements an on-chip test tone generator for built-in spur testing. In an example aspect, an integrated circuit includes a test tone generator, which can be selectively coupled to at least one signal propagation path to perform aspects of built-in spur testing. During built-in spur testing, the test tone generator injects a test signal into the signal propagation path. The test tone generator can be implemented using an amplitude control circuit and a phase-locked loop. In some implementations, the phase-locked loop may have a dual purpose and can be time-shared by a mission mode and the built-in spur testing to conserve space within the integrated circuit and save cost. With the test tone generator implemented on chip (e.g., within the integrated circuit), spur testing can be performed without using a costly, bulky, power-hungry, and/or slower external signal generator.

In an example aspect, an apparatus for performing aspects of built-in spur testing is described. The apparatus includes an integrated circuit with a test tone generator, at least one reference signal generator, and at least one signal propagation path. The test tone generator includes an amplitude control circuit. The at least one signal propagation path includes a transceiver path, a mixer, and a switch. The transceiver path is configured to be coupled to an antenna. The mixer has a first input coupled to the at least one reference signal generator. The switch is configured to selectively couple a second input of the mixer to the transceiver path or the amplitude control circuit of the at least one test tone generator.

In an example aspect, an apparatus for performing aspects of built-in spur testing is described. The apparatus includes an integrated circuit with means for generating a test signal. The integrated circuit also includes means for generating a reference signal. Additionally, the integrated circuit includes means for performing frequency conversion based on the reference signal. Furthermore, the integrated circuit includes means for propagating a signal provided by an antenna. The integrated circuit further includes means for selectively connecting the means for performing frequency conversion to the means for propagating or to the means for generating the test signal.

In an example aspect, a method for operating an integrated circuit is disclosed. The method includes generating a test signal using a test tone generator of the integrated circuit. The method also includes generating a reference signal using a reference signal generator of the integrated circuit. The method additionally includes connecting an input of a mixer of the integrated circuit to the test tone generator using a switch of the integrated circuit. The method further includes disconnecting the input of the mixer from a node associated with an antenna using the switch.

In an example aspect, an apparatus with an on-chip test tone generator for built-in spur testing is disclosed. The apparatus includes an integrated circuit. The integrated circuit includes multiple reference signal generators, multiple signal propagation paths; and a test tone generator. The multiple reference signal generators are configured to generate respective reference signals. The multiple signal propagation paths are respectively configured to perform frequency-conversion operations based on the reference signals. The test tone generator is configured to inject a test signal into at least one of the multiple signal propagation paths.

BRIEF DESCRIPTION OF DRAWINGS

FIG. 1 illustrates an example computing device with an on-chip test tone generator for built-in spur testing.

FIG. 8 illustrates a first flow diagram illustrating an example process performed by an integrated circuit for built-in spur testing.

FIG. 9 illustrates a second flow diagram illustrating an example process performed by a mode controller for spur measurement.

FIG. 10 illustrates a third flow diagram illustrating an example process performed by a mode controller for spur-source diagnosis.

FIG. 11 illustrates a fourth flow diagram illustrating an example process performed by a mode controller for spur-source diagnosis.

FIG. 12 illustrates a fifth flow diagram illustrating an example process performed by a mode controller for spur dodging.

DETAILED DESCRIPTION

Figure 2:
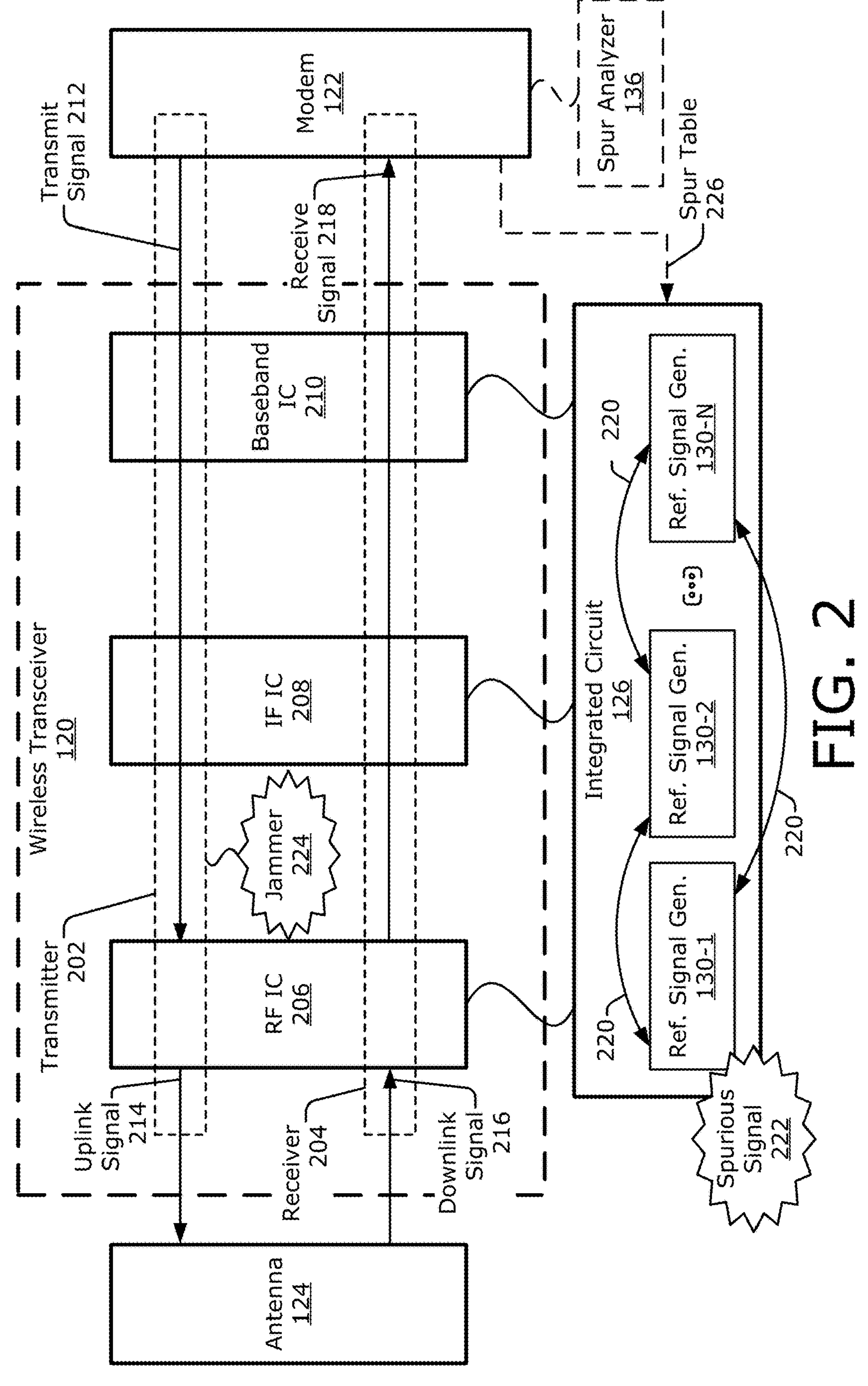
FIG. 2 illustrates examples of a wireless transceiver and a modem capable of performing aspects of built-in spur testing using an on-chip test tone generator.

Some electronic devices may include a wireless transceiver with multiple signal propagation paths. The signal propagation paths can process communication signals associated with different frequency bands to support techniques such as carrier aggregation. With concurrent operation of these signal propagation paths, interference generated by one signal propagation path can negatively impact performance of another signal propagation path, which is referred to as a victim signal propagation path. This interference can desensitize the wireless transceiver and make it challenging to detect desired signals that are received using the victim signal propagation path.

One source of interference is caused by the unintentional electromagnetic coupling between reference signal generators associated with different signal propagation paths. While generating reference signals for frequency conversion operations, the electromagnetic coupling between reference signal generators can cause a spurious signal to also be generated. The spurious signal represents an undesired signal and can also be referred to as a spur, a spurious frequency, or a spurious tone. At one of the reference signal generators, the spurious signal can have a frequency that is offset relative to a frequency of the generated reference signal. Although this frequency can be outside a passband of the victim signal propagation path, the spurious signal can mix with another signal, such as a jammer, and cause a resulting signal to have a frequency that is within the passband of the signal propagation path. Consequently, filters within the victim signal propagation path may be unable to attenuate the noise caused by the spurious signal, which can degrade a signal-to-noise ratio.

To better understand the spurious signals generated by the electromagnetic coupling between reference signal generators, some manufacturers perform spur testing using external test equipment. The external test equipment can at least include an external signal generator, which is coupled to the wireless transceiver and injects a test tone into a signal propagation path. Sometimes the external test equipment also includes an external signal analyzer, which is coupled to a later part of the signal processing path to measure characteristics of the spurious signal.

Although the external signal generator can be used for spur testing, it can be expensive and require additional storage space. Some external signal generators may also be slow to tune to different frequencies, taking at least a few seconds for each frequency step. This can significantly increase a duration of the spur testing, which can make the spur testing cumbersome to execute.

To address these issues, techniques for implementing an on-chip test tone generator for built-in spur testing are described herein. In an example aspect, an integrated circuit includes a test tone generator, which can be selectively coupled to at least one signal propagation path and perform aspects of built-in spur testing. During built-in spur testing, the test tone generator injects a test signal into the signal propagation path. The test tone generator can readily adjust a frequency and/or amplitude of the test signal to perform different aspects of built-in spur testing. In some implementations, the test tone generator can be tuned to different frequencies faster than some external signal generators. As such, it can be less cumbersome and quicker to perform built-in spur testing using the test tone generator compared to performing spur testing using an external signal generator.

The test tone generator can be implemented using an amplitude control circuit and a phase-locked loop. In some implementations, the phase-locked loop may have a dual purpose and can be time-shared by a mission mode and the built-in spur testing to conserve space within the integrated circuit and save cost. In some implementations, the test tone generator can consume less power compared to an external signal generator. This means that built-in spur testing can be performed more efficiently using the test tone generator compared to performing spur testing (e.g., non-built-in spur testing) using an external signal generator. With the test tone generator implemented on chip (e.g., within the integrated circuit), spur testing can be performed without using a costly, bulky, power-hungry, and/or slower external signal generator.

Figure 1:
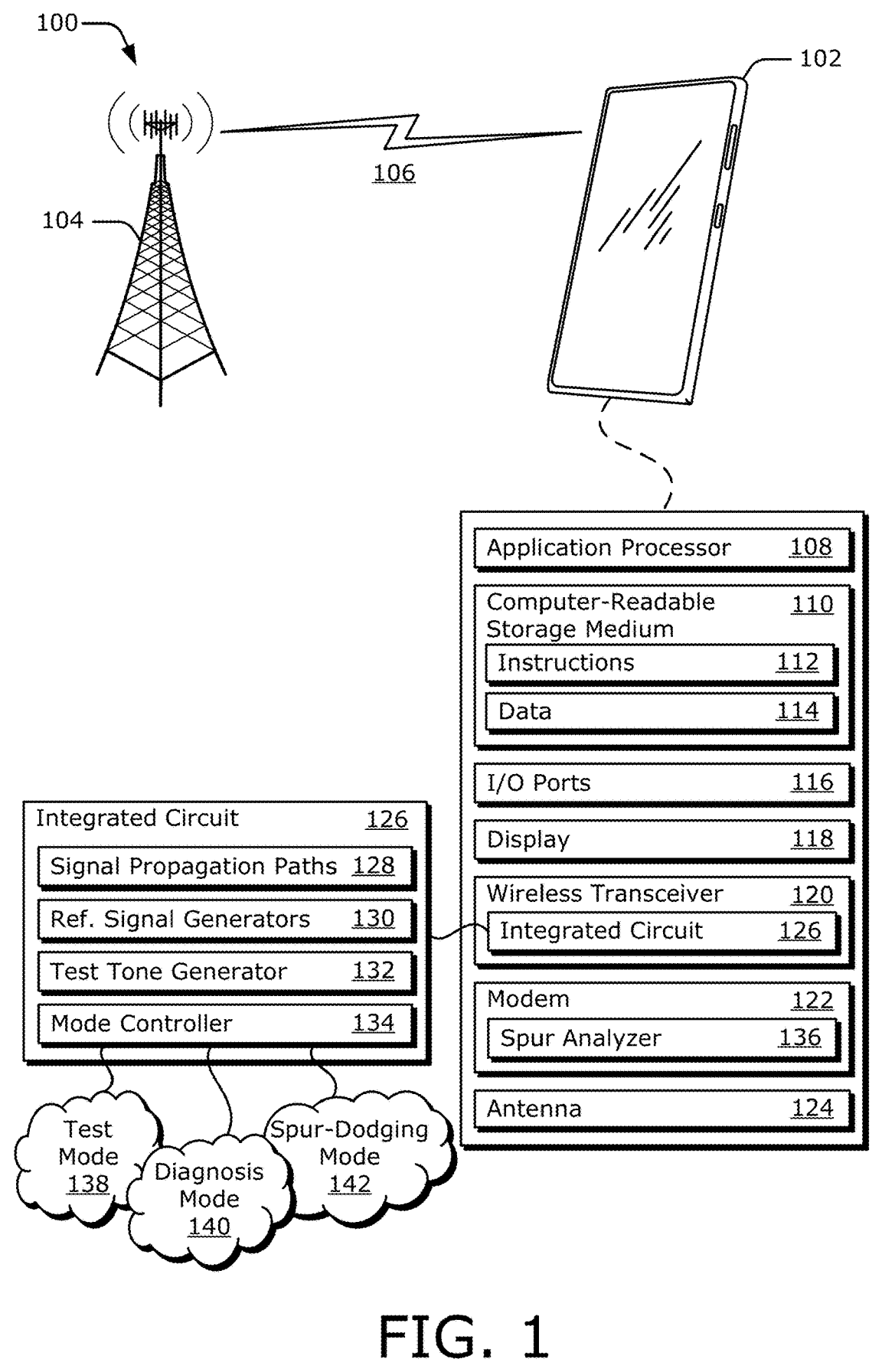

FIG. 1 illustrates an example environment 100 for implementing an on-chip test tone generator for built-in spur testing. In the environment 100, a computing device 102 communicates with a base station 104 through a wireless communication link 106 (wireless link 106). In this example, the computing device 102 is depicted as a smartphone. However, the computing device 102 can be implemented as any suitable computing or electronic device, such as a modem, a cellular base station, a customer premises equipment (CPE), a broadband router, an access point, a cellular phone, a gaming device, a navigation device, a media device, a laptop computer, a desktop computer, a tablet computer, a wearable computer, a server, a network-attached storage (NAS) device, a smart appliance or other internet of things (IoT) device, a medical device, a vehicle-based communication system, a radar, a radio apparatus, and so forth.

The base station 104 communicates with the computing device 102 via the wireless link 106, which can be implemented as any suitable type of wireless link. Although depicted as a tower of a cellular network, the base station 104 can represent or be implemented as another device, such as a satellite, a server device, a terrestrial television broadcast tower, an access point, a peer-to-peer device, a mesh network node, and so forth. Therefore, the computing device 102 may communicate with the base station 104 or another device via a wireless connection.

The wireless link 106 can include a downlink of data or control information communicated from the base station 104 to the computing device 102, an uplink of other data or control information communicated from the computing device 102 to the base station 104, or both a downlink and an uplink. The wireless link 106 can be implemented using any suitable communication protocol or standard, such as $2^{nd}$-generation (2G), $3^{rd}$-generation (3G), $4^{th}$-generation (4G), or $5^{th}$-generation (5G) cellular; IEEE 802.11 (e.g., Wi-Fi®); IEEE 802.15 (e.g., Bluetooth®); IEEE 802.16 (e.g., WiMAX®); and so forth. In some implementations, the wireless link 106 may wirelessly provide power and the base station 104 or the computing device 102 may comprise a power source.

As shown, the computing device 102 includes an application processor 108 and a computer-readable storage medium 110 (CRM 110). The application processor 108 can include any type of processor, such as a multi-core processor, that executes processor-executable code stored by the CRM 110. The CRM 110 can include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 can also include input/output ports 116 (I/O ports 116) and/or a display 118. The I/O ports 116 enable data exchanges or interaction with other devices, networks, or users. The I/O ports 116 can include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternatively or additionally, the display 118 can be implemented as a display port or virtual interface, through which graphical content of the computing device 102 is presented.

A wireless transceiver 120 of the computing device 102 provides connectivity to respective networks and other electronic devices connected therewith. The wireless transceiver 120 can facilitate communication over any suitable type of wireless network, such as a wireless local area network (WLAN), peer-to-peer (P2P) network, mesh network, cellular network, ultra-wideband (UWB) network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via an antenna 124. Components of the wireless transceiver 120 can include amplifiers, switches, mixers, analog-to-digital converters, filters, and so forth for conditioning the communication signals (e.g., for generating or processing signals). The wireless transceiver 120 can also include logic to perform in-phase/quadrature (I/Q) operations, such as synthesis, encoding, modulation, decoding, demodulation, and so forth. In some cases, components of the wireless transceiver 120 are implemented as separate transmitter and receiver entities. Additionally or alternatively, the wireless transceiver 120 can be realized using multiple or different sections to implement respective transmitting and receiving operations (e.g., separate transmit and receive chains). In general, the wireless transceiver 120 processes data and/or signals associated with communicating data of the computing device 102 over the antenna 124.

The computing device 102 also includes a modem 122, which is coupled to the wireless transceiver 120. The modem 122, which may comprise one or more processors, can be implemented within or separate from the wireless transceiver 120. Although not explicitly shown, the modem 122 can include a portion of the CRM 110 or can access the CRM 110 to obtain computer-readable instructions. The modem 122 controls and configures the wireless transceiver 120. The modem 122 can include baseband circuitry to perform high-rate sampling processes that can include analog-to-digital conversion, digital-to-analog conversion, Fourier transforms, gain correction, skew correction, frequency translation, and so forth. The modem 122 can provide communication data to the wireless transceiver 120 for transmission. The modem 122 can also process baseband signals obtained from the wireless transceiver 120 to generate data, which can be provided to the computing device 102.

The wireless transceiver 120 includes at least one integrated circuit 126. Examples of the integrated circuit 126 are further described with respect to FIG. 2. The integrated circuit 126 includes multiple signal propagation paths 128 and multiple reference signal generators 130, which are respectively coupled to the multiple signal propagation paths 128. The signal propagation paths 128 are associated with different frequencies or different frequency bands. In some aspects, the signal propagation paths 128 represent different receive channels of the wireless transceiver 120, and the different frequencies represent different carrier frequencies associated with carrier aggregation. Example components of a signal processing path 128 are further described with respect to FIGS. 3 and 4.

Each reference signal generator 130 provides a substantially stable frequency reference for frequency conversion operations performed within a corresponding signal processing path 128. Example components of the reference signal generator 130 are further described with respect to FIG. 5. At least two of the reference signal generators 130 can be coupled together through unintentional electromagnetic coupling. This electromagnetic coupling can cause a spurious signal to be generated, as further described with respect to FIGS. 2 and 6.

To perform built-in spur testing, the integrated circuit 126 includes at least one test tone generator 132 and at least one mode controller 134. The test tone generator 132 represents an on-chip test tone generator because it is implemented on the integrated circuit 126. More specifically, it is integrated on a same integrated circuit 126 as the reference signal generators 130 that are electromagnetically coupled together and generate the spurious signal. By integrating the test tone generator 132 on the integrated circuit 126, the integrated circuit 126 can perform spur testing without the use of an external signal generator. Spur testing performed using the test tone generator 132 is referred to as "built-in" spur testing because the test tone generator 132 enables the spur testing to be performed without the external signal generator and optionally without other integrated circuits associated with the computing device 102. An example implementation of the test tone generator 132 is further described with respect to FIG. 7.

Use of the test tone generator 132 obviates the use of an external signal generator for spur testing. In some example implementations, the test tone generator 132 can be cheaper to implement compared to the external signal generator, can consume less power than the external signal generator, and/or can be tuned to different frequencies faster than the external signal generator. The test tone generator 132 can also utilize existing components within the integrated circuit 126 to reduce a footprint of the test tone generator 132. During built-in spur testing, the test tone generator 132 injects a test signal into a signal propagation path 128 to enable characterization of one or more spurious signals generated by the reference signal generators 130.

The mode controller 134 can be implemented using software, firmware, hardware, fixed-logic circuitry, or combinations thereof. In some implementations, the mode controller is implemented using a digital circuit. The mode controller 134 can configure components of the integrated circuit 126, including one or more components of the signal processing paths 128, the reference signal generators 130, and the test tone generator 132. In some implementations, the mode controller 134 has a register template with a list of configurations for supporting different operational modes, including modes associated with built-in spur testing.

The mode controller 134 can operate in accordance with various modes. One set of modes is associated with built-in spur testing and includes a test mode 138 and a diagnosis mode 140. Based on the test mode 138, the mode controller 134 configures the integrated circuit 126 in a manner that supports a spur measurement process, which can be part of the built-in spur testing. During the spur measurement process, a power level of a spurious signal can be measured by a spur analyzer 136 implemented by the modem 122 or by an external signal analyzer. An example spur measurement process is further described with respect to FIG. 9 and involves the mode controller 134 tuning a frequency generated by one of the reference signal generators 130 and tuning a frequency generated by the test tone generator 132.

For the diagnosis mode 140, the mode controller 134 configures the integrated circuit 126 in a manner that supports a spur-source diagnosis process, which can also be part of the built-in spur testing. During the spur-source diagnosis process, the spur analyzer 136 or the external signal analyzer determines (e.g., identifies) one or more aspects of the electromagnetically-coupled reference signal generators 130 that contribute to a generation of the spurious signal. An example spur-source diagnosis process is further described with respect to FIGS. 10 and 11. The spur-source diagnosis process can involve the activation (e.g., enabling) of different pairs of reference signal generators 130, disabling a circuit associated with one of the reference signal generators 130, or configuring one of the reference signal generators 130 to use a different type of voltage-controlled oscillator.

Spur-dodging mode 142 represents a mode that can be performed while the wireless transceiver 120 operates in accordance with a mission mode (e.g., a wireless communication mode). For the spur-dodging mode 142, the mode controller 134 configures the integrated circuit 126 in a manner that attenuates one or more spurious signals and improves performance of the wireless transceiver 120 during the mission mode. With the spur-dodging mode 142, the mode controller 134 can optimally configure the integrated circuit 126 based on the information gathered as part of the spur measurement and/or the spur-source diagnosis processes. Example operations associated with the spur-dodging mode 142 are further described with respect to FIG. 12.

The modem 122 can optionally implement the spur analyzer 136. The spur analyzer 136 can measure power levels of spurious signals as part of the spur measurement process. For example, the spur analyzer 136 can perform a single-point discrete Fourier transform (DFT) to measure power at a particular frequency. Additionally or alternatively, the spur analyzer 136 can determine a source associated with the spurious signal as part of the spur-source diagnosis process. During built-in spur testing, the spur analyzer 136 can generate information, such as a spur table, that enables the mode controller 134 to appropriately configure the integrated circuit 126 based on the spur-dodging mode 142.

For implementations of the computing device 102 that do not include the spur analyzer 136 within the modem 122, operations described above with respect to the spur analyzer 136 can alternatively be performed using an external signal analyzer. Although the external signal analyzer can be more expensive, bulky, and cumbersome to use compared to the spur analyzer 136, the external signal analyzer enables aspects of built-in spur testing to be performed without the use of the modem 122. This can be beneficial in situations in which the modem 122 is not available.

Although not explicitly shown, the integrated circuit 126 can include multiple voltage-controlled oscillators. The multiple voltage-controlled oscillators can be implemented using inductor-capacitor (LC) oscillators, ring oscillators, other types of oscillators, or combinations thereof. At least some of these voltage-controlled oscillators are used to implement the reference signal generators 130 and/or the test tone generator 132. In an example implementation, the reference signal generators 130 are implemented using a first type of oscillator, such as inductor-capacitor oscillators, and the test tone generator is implemented using a second type of oscillator, such as a ring oscillator. Also, in some implementations, the mode controller 134 can dynamically change which type of voltage-controlled oscillator is used by a reference signal generator 130 and/or the test tone generator 132, as further described with respect to FIG. 10. The wireless transceiver 120 is further described with respect to FIG. 1.

FIG. 2 illustrates examples of a wireless transceiver 120 and a modem capable of performing at least some aspects of built-in spur testing using the test tone generator 132. The wireless transceiver 120 is coupled between the antenna 124 and the modem 122. Together, the wireless transceiver 120 and the modem 122 implement a transmitter 202 and a receiver 204. The transmitter 202 and the receiver 204 can be coupled to a same antenna 124 or to different antennas 124. The antenna 124 (or antennas 124) can represent a stand-alone antenna or an antenna element of an antenna array.

In the depicted configuration, the wireless transceiver 120 represents a superheterodyne transceiver, which includes a radio-frequency integrated circuit 206 (RF IC 206), an intermediate-frequency integrated circuit 208 (IF IC 208), and a baseband integrated circuit 210 (baseband IC 210). In other implementations (not shown), the wireless transceiver 120 can be implemented as a direct-conversion transceiver (or zero-IF transceiver) with the radio-frequency integrated circuit 206 and the baseband integrated circuit 210 and without the intermediate-frequency integrated circuit 208. In some examples in which the superheterodyne transceiver is implemented, components of the intermediate-frequency and baseband circuits can be combined to implement a single integrated circuit instead of the separate integrated circuits illustrated in FIG. 2.

The radio-frequency integrated circuit 206 can represent a radio-frequency front-end of the wireless transceiver 120, which may or may not include the antenna 124. In general, the radio-frequency integrated circuit 206 includes components that are designed to operate on analog signals having radio frequencies. The intermediate-frequency integrated circuit 208 includes components that are designed to operate on analog signals having intermediate frequencies. The baseband integrated circuit 210 includes components that are designed to operate at analog and/or digital signals having baseband frequencies. Components of the radio-frequency integrated circuit 206, the intermediate-frequency integrated circuit 208, and the baseband integrated circuit 210 can include amplifiers, phase shifters, filters, mixers, and switches. The baseband integrated circuit 210 can also include analog-to-digital converters and digital-to-analog converters.

The integrated circuit 126 can represent the radio-frequency integrated circuit 206, the intermediate-frequency integrated circuit 208, the baseband integrated circuit 210, or some combination thereof. The integrated circuit 126 includes multiple reference signal generators 130-1, 130-2 . . . 130-N, where N represents a positive integer.

The spur analyzer 136 can be implemented within the modem 122, as shown in FIG. 2. Other implementations are also possible in which the spur analyzer 136 is implemented within one of the circuits of the wireless transceiver 120, such as the baseband integrated circuit 210.

Figure 3:
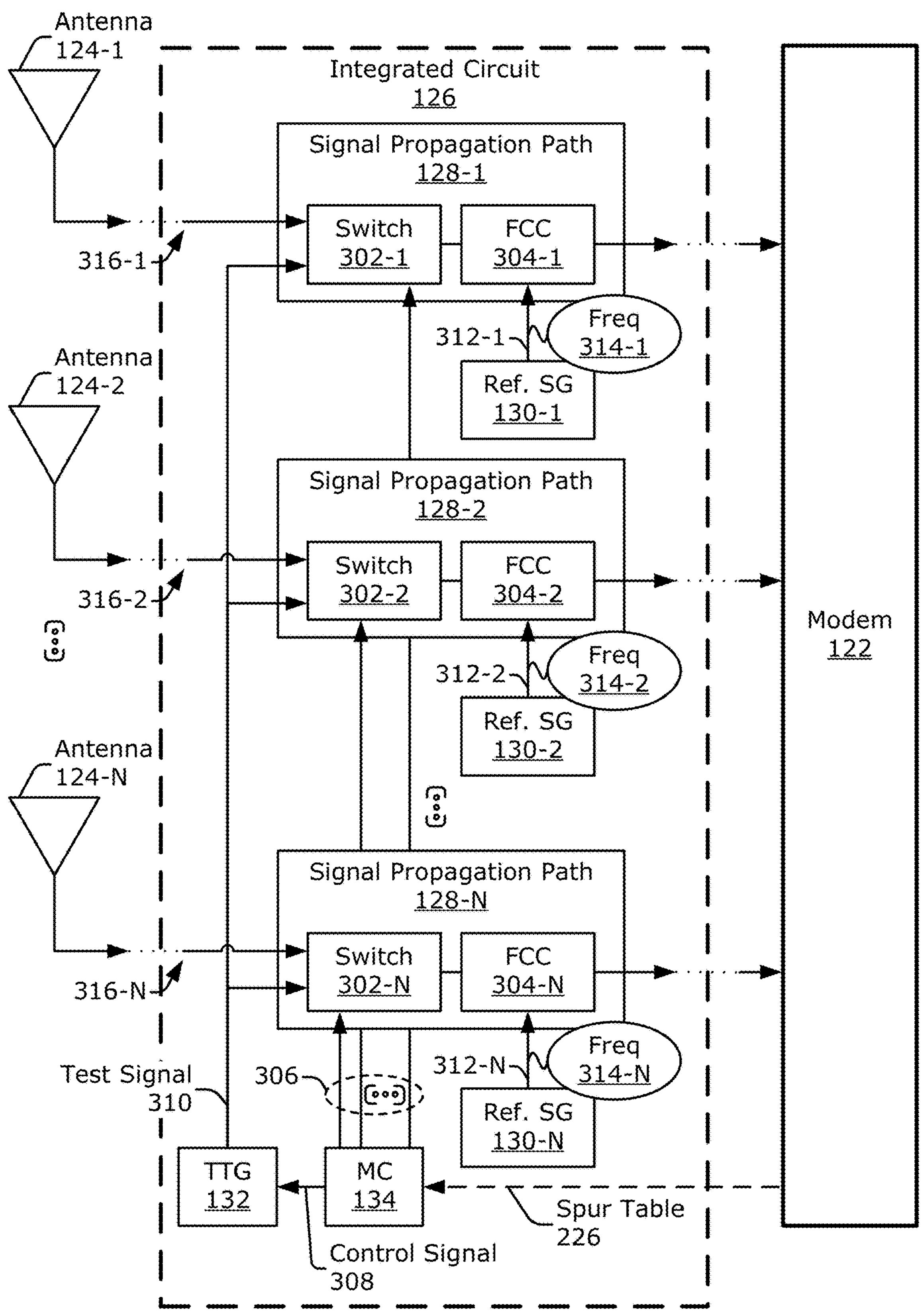
FIG. 3 illustrates example components of an integrated circuit capable of performing aspects of built-in spur testing using an on-chip test tone generator.

During built-in spur testing, the integrated circuit 126 injects a test signal into a signal propagation path 128 of the integrated circuit 126, as further described with respect to FIG. 3. Based on information collected by the spur analyzer 136 (or an external signal analyzer), the modem 122 can pass information to the mode controller 134 to enable the mode controller 134 to appropriately configure the integrated circuit 126 in a manner that attenuates a spurious signal based on the spur-dodging mode 142.

During a mission mode, such as wireless communication, the modem 122 generates a transmit signal 212, which can include communication data. The transmitter 202 uses the transmit signal 212 to generate an uplink signal 214. For example, the baseband integrated circuit 210 can convert the transmit signal 212 from a digital domain to an analog domain. The intermediate-frequency integrated circuit 208 can upconvert the transmit signal 212 from baseband frequencies to intermediate frequencies. The radio-frequency integrated circuit 206 can upconvert the transmit signal 212 from intermediate frequencies to radio frequencies and/or amplify the transmit signal 212 to generate the uplink signal 214.

The antenna 124 can additionally receive a downlink signal 216 during wireless communication. The receiver 204 generates a receive signal 218 based on the downlink signal 216. For example, the radio-frequency integrated circuit 206 amplifies the downlink signal 216 and/or downconverts the downlink signal 216 from radio frequencies to intermediate (or baseband) frequencies to generate the receive signal 218. The intermediate-frequency integrated circuit 208 downconverts the receive signal 218 from intermediate frequencies to baseband frequencies. The baseband integrated circuit 210 converts the receive signal 218 from the analog domain to the digital domain. The modem 122 analyzes a digital version of the receive signal 218 to perform other operations associated with the wireless communication mode.

During the mission mode, electromagnetic coupling 220 between at least one pair of reference signal generators 130-1 to 130-N can cause a spurious signal 222 to be generated. Also, coupling between the transmitter 202 and the receiver 204 can cause a jammer 224 to propagate through the receiver 204. In this case, the jammer 224 represents the transmit signal 212 or the uplink signal 214. In some situations, the spurious signal 222 can mix with the jammer 224 and degrade a signal-to-noise ratio associated with the receive signal 218.

To mitigate the impact of the spurious signal 222, the mode controller 134 can configure the integrated circuit 126 based on a spur table 226 provided by the modem 122 as shown in FIG. 2. Other implementations are also possible in which the spur table 226 is provided to the mode controller 134 by the external signal analyzer or an engineer. With the spur table 226, the mode controller 134 can appropriately configure the integrated circuit 126 for spur dodging. Example operations of the integrated circuit 126 during built-in spur testing are further described with respect to FIG. 3.

FIG. 3 illustrates example components of an integrated circuit 126 capable of performing aspects of built-in spur testing using the test tone generator 132. The integrated circuit 126 is coupled between multiple antennas 124-1, 124-2 . . . 124-N and the modem 122. In the depicted configuration, the integrated circuit 126 includes multiple signal propagation paths 128-1, 128-2 . . . 128-N, the reference signal generators 130-1 to 130-N (Ref. SG 130-1 to 130-N), the test tone generator 132 (TTG 132), and the mode controller 134 (MC 134). The signal propagation paths 128-1 to 128-N respectively include switches 302-1, 302-2 . . . 302-N and frequency conversion circuits 304-1, 304-2 . . . 304-N (FCC 304-1 to 304-N).

The signal propagation paths 128-1 to 128-N can be associated with different receive channels of the receiver 204. In this example, the switches 302-1 to 302-N of the signal propagation paths 128-1 to 128-N are respectively coupled to transceiver paths 316-1, 316-2 . . . 316-N. The transceiver paths 316-1 to 316-N are respectively coupled to the antennas 124-1 to 124-N. Each transceiver path 316 represents a portion of a signal propagation path 128 that is between an antenna 124 and a switch 302.

Other implementations are also possible in which at least a portion of the switches 302-1 to 302-N are coupled to a same transceiver path 316 (or coupled to a same antenna 124). In this case, there can be another component, such as a filter, that passes different frequency components of a received signal to the different signal propagation paths 128-1 to 128-N.

The switches 302-1 to 302-N are also coupled to the test tone generator 132. In an example implementation, the switches 302-1 to 302-N are implemented as single-pole, double-throw (SPDT) switches. In this case, first throws of the switches 302-1 to 302-N are respectively coupled to the transceiver paths 316-1 to 316-N (or coupled to the antennas 124-1 to 124-N), and second throws of the switches 302-1 to 302-N are coupled to the test tone generator 132. Poles of the switches 302-1 to 302-N are respectively coupled directly or indirectly to the frequency conversion circuits 304-1 to 304-N. Other implementations of the switches 302-1 to 302-N are also possible. For example, the switches 302-1 to 302-N can be implemented using one or more multiplexers or other types of switching circuits.

Each of the switches 302-1 to 302-N can be in one of two states. In a first state, the switches 302 connects a corresponding transceiver path 316 (or a corresponding antenna 124) to a corresponding frequency conversion circuit 304 and disconnects the test tone generator 132 from the frequency conversion circuit 304. In a second state, the switch 302 connects the test tone generator 132 to the corresponding frequency conversion circuit 304 and disconnects the corresponding transceiver path 316 (or the corresponding antenna 124) from the frequency conversion circuit 304. Two or more of the switches 302-1 to 302-N can be in the first state in accordance with a mission mode (e.g., during wireless communication). At least one of the switches 302-1 to 302-N can be in the second state during built-in spur testing.

Figure 4:
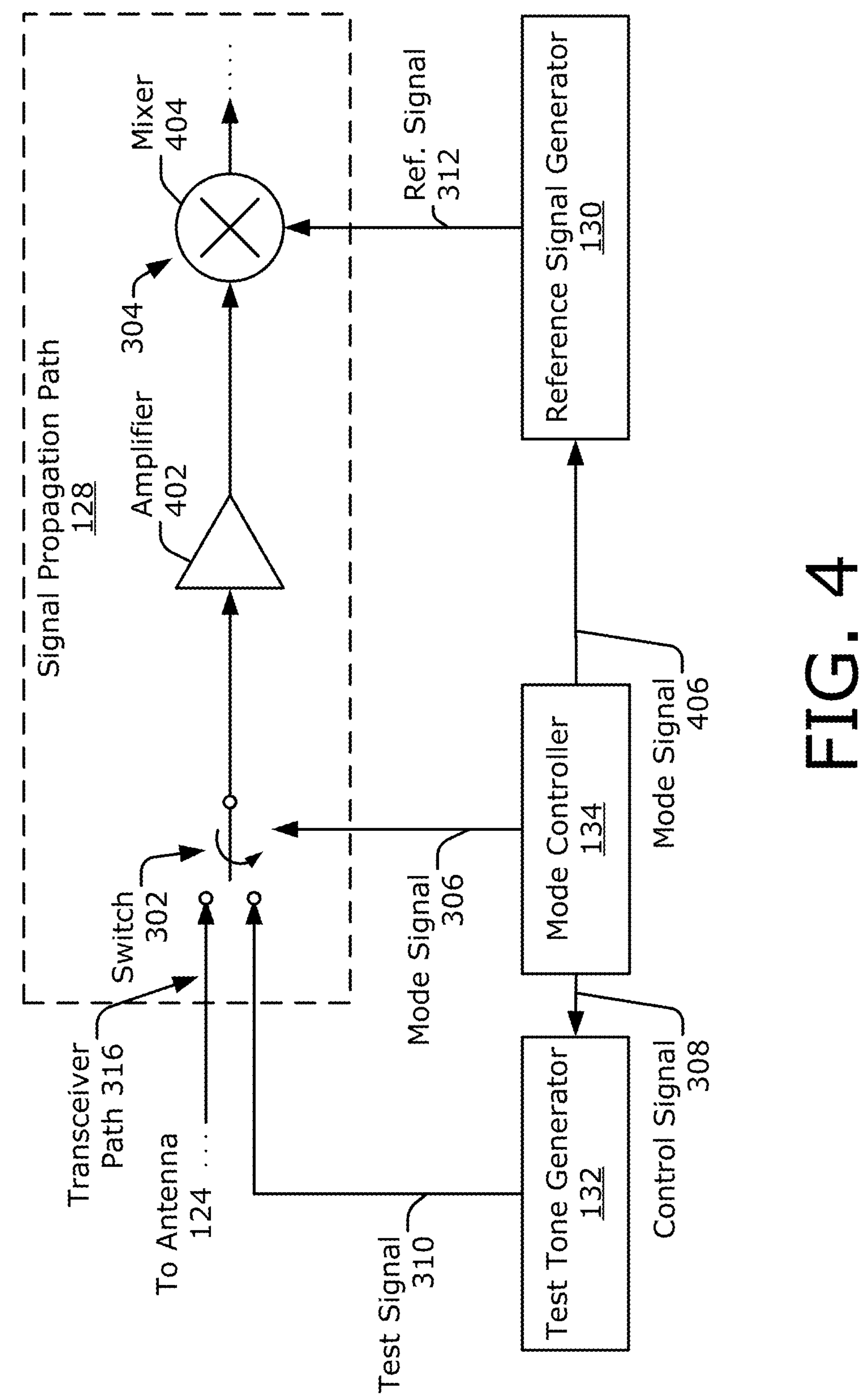
FIG. 4 illustrates example components of a signal propagation path implemented within an integrated circuit.

The frequency conversion circuits 304-1 to 304-N perform frequency up-conversion or down-conversion operations. The frequency conversion circuits 304-1 to 304-N can be implemented using mixers, as shown in FIG. 4. The reference signal generators 130-1 to 130-N are respectively coupled to first inputs of the frequency conversion circuits 304-1 to 304-N. The switches 302-2 to 302-N are respectively coupled to second inputs of the frequency conversion circuits 304-1 to 304-N.

The mode controller 134 is coupled to the test tone generator 132 and the switches 302-1 to 302-N. The mode controller 134 controls the states of the switches 302-1 to 302-N. Although not explicitly shown in FIG. 3, the mode controller 134 can also be coupled to the reference signal generators 130-1 to 130-N to control operations of the reference signal generators 130-1 to 130-N.

In general, the mode controller 134 generates mode signals 306 to control the states of the switches 302-1 to 302-N. During the built-in spur testing, the mode controller 134 can use the mode signals 306 to cause one of the switches 302-1 to 302-N to be in the second state and the remaining switches 302-1 to 302-N to be in the first state. For example, the mode controller 134 can use the mode signals 306 to cause the switch 302-1 to be in the second state and the switches 302-2 to 302-N to be in the first state to perform built-in spur testing using the signal propagation path 128-1. As another example, the mode controller 134 can use the mode signals 306 to cause the switch 302-N to be in the second state and the switches 302-1 to 302-(N−1) to be in the first state to perform built-in spur testing using the signal propagation path 128-N.

During built-in spur testing, the mode controller 134 also generates a control signal 308. With the control signal 308, the mode controller 134 configures the test tone generator 132 to generate a test signal 310 have a particular frequency and amplitude (or power), as further described with respect to FIG. 7.

Although not explicitly shown in FIG. 3, the mode controller 134 can also generate other mode signals (e.g., mode signals 406 of FIG. 4) to configure the reference signal generators 130-1 to 130-N. Using the mode signals 406, the mode controller 134 activates at least two of the reference signal generators 130-1 to 130-N during the built-in spur testing and the mission mode. While active, the reference signal generators 130-1 to 130-N can respectively generate reference signals 312-1, 312-2 . . . 312-N. The reference signals 312-1 to 312-N are associated with different frequencies 314-1, 314-2 . . . 314-N.

During the built-in spur testing, the test signal 310 propagates through one of the signal propagation paths 128-1 to 128-N. The frequency conversion circuit 304 of the signal propagation path 128 downconverts the test signal 310 using the reference signal 312. With at least two of the reference signal generators 130-1 to 130-N activated, the test signal 310 can be modulated by the spurious signal 222 that results from the electromagnetic coupling between these activated reference signal generators 130-1 to 130-N. The downconverted signal can be passed to the spur analyzer 136 of the modem 122 or the external signal analyzer.

During a mission mode, the mode controller 134 can use the mode signals 306 to cause at least two of the switches 302 to be in the first state to enable the corresponding signal propagation paths 128 to perform operations associated with the mission mode. For instance, the signal propagation paths 128-1 to 128-2 having switches 302-1 to 302-2 in the first state can receive and process signals provided by the antennas 124-1 to 124-2. In some cases, the mode controller 134 uses the mode signals 306 and/or 406 to perform spur dodging, as further described with respect to FIG. 12. An example signal propagation path 128 is further described with respect to FIG. 4.

FIG. 4 illustrates example components of a signal propagation path 128 of the integrated circuit 126. The signal propagation path 128 depicted in FIG. 4 can represent any of the signal propagation paths 128-1 to 128-N in FIG. 3. In this example, the integrated circuit 126 represents the radio-frequency integrated circuit 206, and the signal propagation path 128 represents a receive channel of the receiver 204.

In the depicted configuration, the signal propagation path 128 includes the switch 302, an amplifier 402, and a mixer 404 (e.g., a downconversion mixer), which represents the frequency conversion circuit 304. The amplifier 402 is coupled between the switch 302 and the mixer 404. In some examples, the amplifier 402 represents a low-noise amplifier of the receiver 204. The mixer 404 includes a first input that is coupled to an output of the amplifier 402 and a second input that is coupled to the reference signal generator 130.

As described above, the mode controller 134 generates the mode signal 306 to appropriately configure the switch 302 and generates the mode signal 406 to appropriately configure the reference signal generator 130 for built-in spur testing or a mission mode. For the built-in spur testing, the mode signal 306 can use the mode signal 306 to cause the switch 302 to be in the second state, which connects the test tone generator 132 to the amplifier 402 and disconnects the transceiver path 316 (or disconnects the antenna 124) from the amplifier 402, as shown in FIG. 4. Although not explicitly shown, the mode controller 134 can configure other components of the integrated circuit 126, such as a gain of the amplifier 402. Example components of the reference signal generator 130 are further described with respect to FIG. 5.

Figure 5:
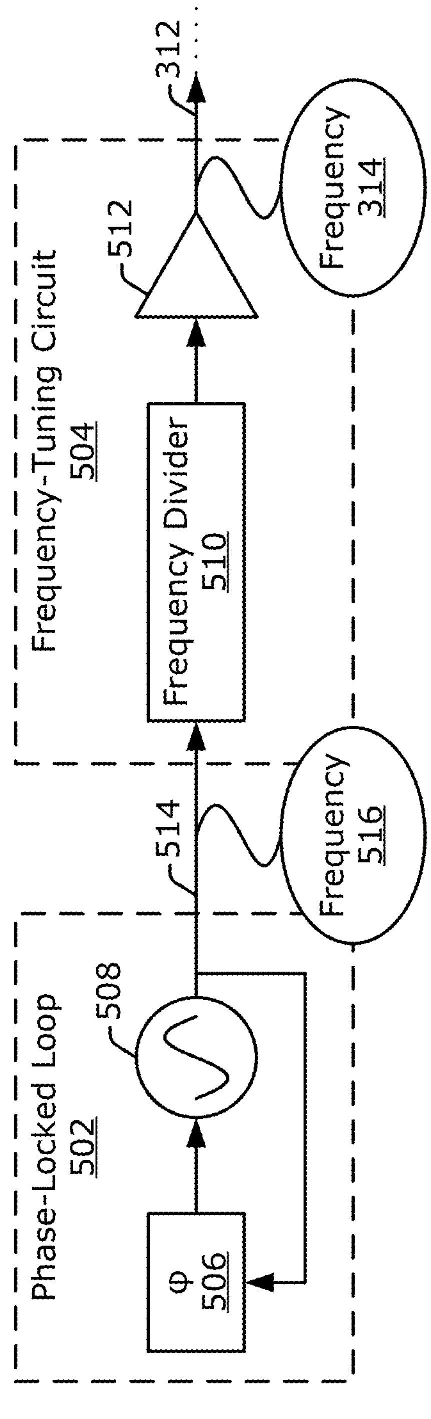
FIG. 5 illustrates example components of a reference signal generator implemented within an integrated circuit.

FIG. 5 illustrates example components of a reference signal generator 130 of the integrated circuit 126. In the depicted configuration, the reference signal generator 130 includes a phase-locked loop 502 and a frequency-tuning circuit 504 (e.g., a local oscillator circuit). The phase-locked loop 502 provides frequency stabilization and includes a phase detector 506 (e.g., a phase comparator or a mixer) and a voltage-controlled oscillator 508. The voltage-controlled oscillator 508 can be implemented using one of the inductor-capacitor (LC) oscillators of the integrated circuit 126, one of the ring oscillators of the integrated circuit 126, or another type of oscillator implemented within the integrated circuit 126.

The frequency-tuning circuit 504 provides additional frequency tuning for a frequency conversion operation performed by a corresponding signal propagation path 128. In this example, the frequency-tuning circuit 504 includes a frequency divider 510 and a buffer 512. The frequency divider 510 adjusts a frequency provided by the phase-locked loop 502, and the buffer 512 provides isolation and/or amplification.

During the built-in spur testing or a mission mode, the voltage-controlled oscillator 508 and the phase detector 506 operate together to generate a signal 514 that has a substantially stable frequency 516. The frequency 516 can be referred to as a voltage-controlled oscillator frequency. The frequency-tuning circuit 504 uses the frequency divider 510 to generate the reference signal 312 having the frequency 314. The frequency 314 can be referred to as a reference frequency or a local oscillator frequency. The phase-locked loop 502 and/or the frequency-tuning circuit 504 can contribute to the generation of the spurious signal 222, as further described with respect to FIG. 6.

Figure 6:
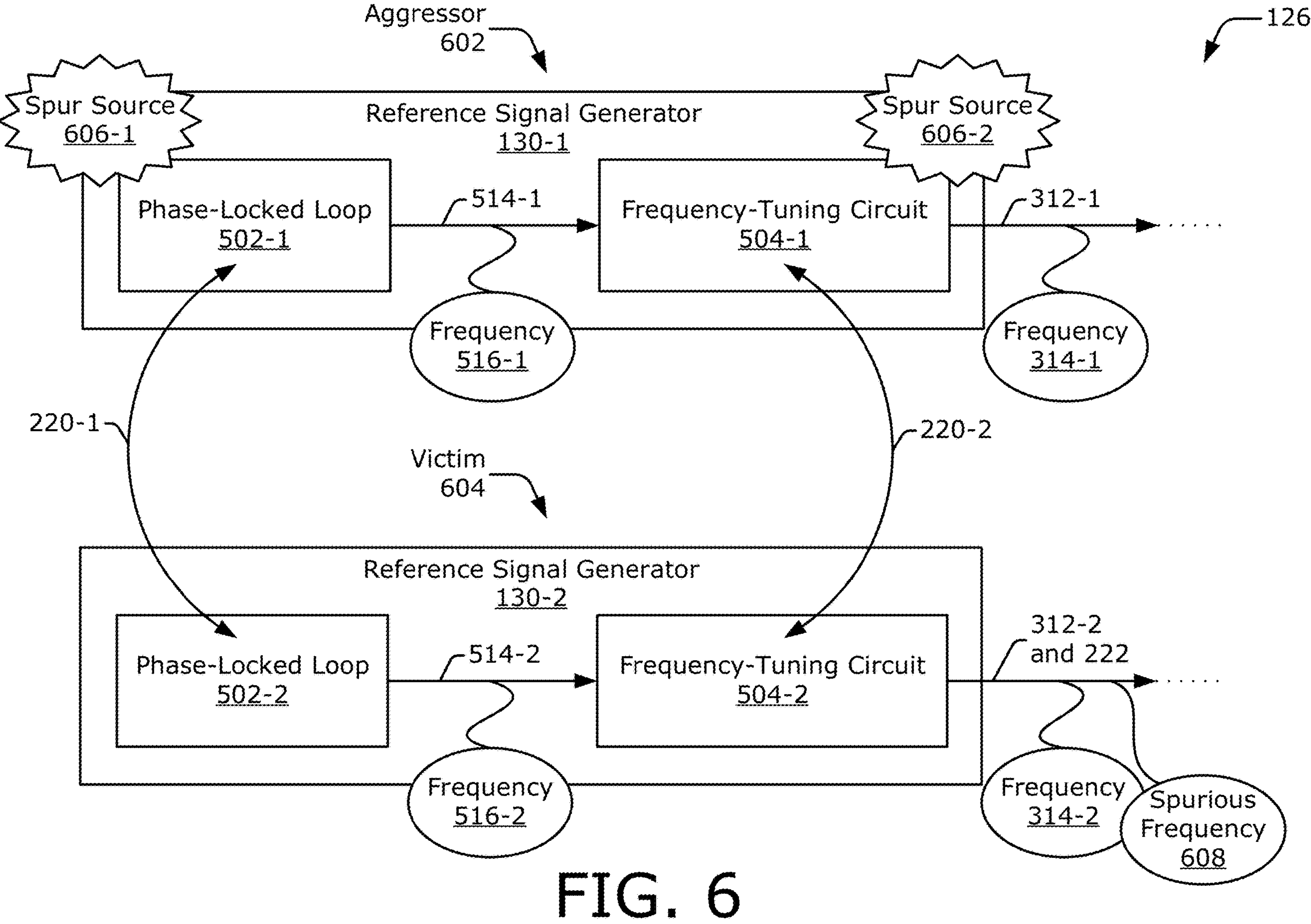
FIG. 6 illustrates example electromagnetic coupling between two reference signal generators.

FIG. 6 illustrates example reference signal generators 130-1 and 130-2 of the integrated circuit 126. The reference signal generators 130-1 and 130-2 can have similar components and perform similar operations as described with respect to the reference signal generator 130 of FIG. 5. The reference signal generators 130-1 and 302-2, for instance, can respectively include phase-locked loops 502-1 and 502-2 and frequency-tuning circuits 504-1 and 504-2. The phase-locked loops 502-1 and 502-2 respectively generate signals 514-1 and 514-2 having respective frequencies 516-1 and 516-2. The frequency-tuning circuits 504-1 and 504-2 respectively generate reference signals 312-1 and 312-2 having respective frequencies 314-1 and 314-.

During operation, the phase-locked loops 502-1 and 502-2 can be unintentionally coupled together by electromagnetic coupling 220-1. Additionally or alternatively, the frequency-tuning circuits 504-1 and 504-2 can be unintentionally coupled together by electromagnetic coupling 220-2.

Consider an example in which the reference signal generator 130-1 represents an aggressor 602 (e.g., an aggressor reference signal generator) and the reference signal generator 130-2 represents a victim 604 (e.g., a victim reference signal generator). In this example, the phase-locked loop 502-1 can represent a first spur source 606-1 and/or the frequency-tuning circuit 504-1 can represent a second spur source 606-2. In some cases, the first spur source 606-1 is dependent on a type of oscillator that implements the voltage-controlled oscillator 508. The electromagnetic coupling 220-1 and/or 220-2 causes a spurious signal 222 to be generated along with (or as a component of) the reference signal 312-2. The spurious signal 222 has a spurious frequency 608 that is based on an absolute value of a difference between frequencies associated with the reference signal generators 130-1 and 130-2.

If the phase-locked loop 502-1 represents a source 606-1 (or a main source) of the spurious signal 222, the spurious frequency 608 can be based, at least partially, on an absolute value of a difference between the frequencies 516-1 and 516-2. If the frequency-tuning circuit 504-1 represents a source 606-2 (or a main source) of the spurious signal 222, the spurious frequency 608 can be based, at least partially, on an absolute value of a difference between the frequencies 314-1 and 314-2. In general, the spurious frequency 608 represents a frequency that is offset relative to the frequency 314-2 by an amount that is equal to an absolute value of the difference between the frequencies 516-1 and 516-2 or 314-1 and 314-2.

Consider examples in which an absolute value of the difference between the frequencies 516-1 and 516-2 or 314-1 and 314-2 is equal to 20, 40, 60, or 80 megahertz (MHz). In these examples, the spurious frequency 608 is equal to the reference signal frequency 314-2±the frequency difference (e.g., ±20, ±40, ±60, or ±80 MHz).

Although the spurious frequency 608 can be outside a passband of the victim signal propagation path 128, the spurious signal 222 can mix with another signal, such as the jammer 224, and cause a resulting signal to have a frequency that is within the passband of the signal propagation path 128. To determine a characteristic of the spurious signal 222, the test tone generator 132 injects the test signal 310 into the signal propagation path 128, as further described with respect to FIG. 7.

Figure 7:
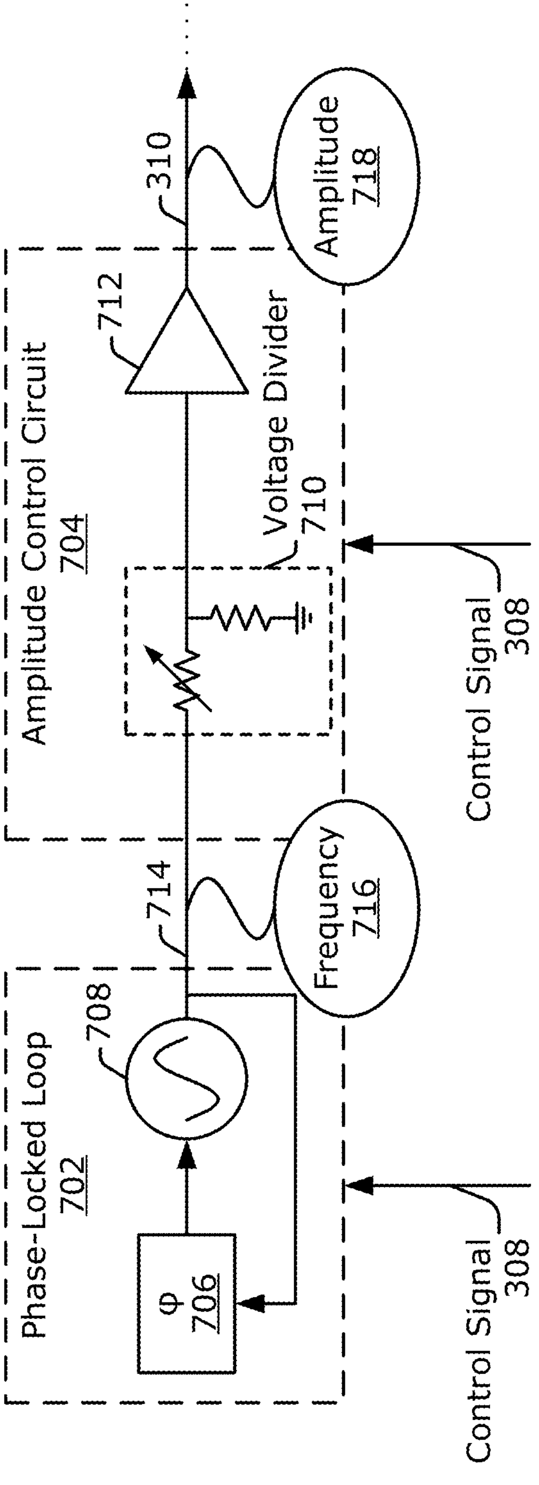
FIG. 7 illustrates example components of a test tone generator implemented within an integrated circuit.

FIG. 7 illustrates example components of the test tone generator 132 implemented within the integrated circuit 126. In the depicted configuration, the test tone generator 132 includes a phase-locked loop 702 and an amplitude control circuit 704. The phase-locked loop 702 provides frequency stabilization for the generation of the test signal 310. The phase-locked loop 702 can be similar to the phase-locked loop 502 of FIG. 5. The phase-locked loop 702, for instance, includes a phase detector 706 and a voltage-controlled oscillator 708, which can be similar to the phase detector 506 and/or the voltage-controlled oscillator 508 of FIG. 5, respectively.

In some implementations, the voltage-controlled oscillator 708 of the test tone generator 132 can be a different type of voltage-controlled oscillator compared to the voltage-controlled oscillator 508 of the reference signal generator 130. For example, the voltage-controlled oscillator 708 can be a ring oscillator, and the voltage-controlled oscillator 508 can be an inductor-capacitor oscillator. The mode controller 134 can also dynamically change which type of voltage-controlled oscillator is utilized by the reference signal generator 130 and/or the test tone generator 132.

In some implementations, the phase-locked loop 702 also operates as a phase-locked loop 502 of one of the reference signal generators 130 that is inactive (e.g., disabled or not being used) during a portion of the built-in spur testing. In this manner, the phase-locked loop 702 can have a dual purpose and can be used by different circuits (e.g., the reference signal generator 130 or the test tone generator 132). In other implementations, the phase-locked loop 702 represents an additional phase-locked loop that is available within the integrated circuit 126. By using a phase-locked loop that is already available, the test tone generator 132 can have a smaller footprint compared to other implementations that implement the test tone generator 132 with a dedicated phase-locked loop that is not used during the mission mode.

The amplitude control circuit 704 appropriately adjusts an amplitude (e.g., power or voltage swing) of the test signal 310 for the built-in spur testing. In an example implementation, the amplitude control circuit 704 includes a voltage divider 710 and a buffer 712. The voltage divider 710 includes a first resistor having a variable resistance and a second resistor having a fixed resistance. Although the voltage divider 710 can have a small size and can be inexpensive, other implementations are also possible in which the amplitude control circuit 704 includes another type of amplifier and/or attenuator that can control an amplitude of the test signal 310. To conserve power, the amplitude control circuit 704 can be implemented using some type of passive attenuator.

During the built-in spur testing, the voltage-controlled oscillator 708 and the phase detector 706 operate together to generate a signal 714 that has a substantially stable frequency 716. The amplitude control circuit 704 uses the voltage divider 710 to adjust an amplitude of the signal 714 such that an amplitude 718 of the generated test signal 310 is approximately equal to a target amplitude. The term "approximately" can mean that a value is within ±2% of a specified value (e.g., within ±1.5%, ±1%, or ±0.5% of the specified value). By setting the amplitude 718 to be approximately equal to the target amplitude, the spur analyzer 136 can measure a power associated with the spurious signal 222. Using the control signal 308, the mode controller 134 can set the frequency 716 and/or the amplitude 718 of the test signal 310. Example processes associated with built-in spur testing are further described with respect to FIGS. 8 to 12.

FIGS. 8-12 are flow diagrams illustrating example processes 800, 900, 1000, 1100, and 1200. The processes 800-1200 are described in the form of a set of blocks 802-808, 902-908, 1002-1008, 1102-1108, and 1202-1208 that specify operations that can be performed. However, operations are not necessarily limited to the order shown in FIGS. 8-12 or described herein, for the operations may be implemented in alternative orders or in fully or partially overlapping manners. Also, more, fewer, and/or different operations may be implemented to perform the processes 800-1200, or an alternative process. Operations represented by the illustrated blocks of the processes 800-1200 may be performed at least partially by a wireless transceiver 120 (e.g., of FIG. 1 or 2) or an integrated circuit 126 (e.g., of FIG. 1, 2, or 3). More specifically, the operations of the process 800-1200 may be performed, at least in part, by a test tone generator 132, as shown in FIGS. 3, 4, and 7, and/or a mode controller 134, as shown in FIGS. 3 and 4.

FIG. 8 describes an example process performed by the integrated circuit 126 for built-in spur testing. At 802, a test signal is generated using a test tone generator of an integrated circuit. For example, the test tone generator 132 of the integrated circuit 126 generates the test signal 310, as shown in FIG. 3. The test signal 310 can have a particular frequency 716 and/or a particular amplitude 718, as described with respect to FIG. 7. The test signal 310 enables a spurious signal 222 to be measured and/or enables a spur source 606 that substantially contributes to a power level of the spurious signal 222 to be identified. In some implementations, the integrated circuit 126 represents a radio-frequency integrated circuit 206 of the wireless transceiver 120, as described with respect to FIG. 2.

At 804, a reference signal is generated using a reference signal generator of the integrated circuit. For example, the reference signal generator 130 of the integrated circuit 126 generates the reference signal 312, as shown in FIGS. 3-5. The reference signal 312 can be associated with a particular frequency 314, and is used during a frequency conversion operation performed by a frequency conversion circuit 304 (e.g., the mixer 404) within a corresponding signal propagation path 128.

At 806, an input of a mixer of the integrated circuit is connected to the test tone generator using a switch of the integrated circuit. For example, the switch 302 of the integrated circuit 126 connects an input of the mixer 404 to the test tone generator 132, as shown in FIG. 4.

At 808, the input of the mixer is disconnected from a transceiver path using the switch. The transceiver path is coupled to an antenna. For example, the switch 302 disconnects the input of the mixer 404 from the transceiver path 316. The transceiver path 316 is coupled to an antenna 124. For implementations in which the integrated circuit 126 does not include the antenna 124, transceiver path 316 can include a terminal of the integrated circuit 126 that can be connected to the antenna 124. In other implementation in which the integrated circuit includes the antenna 124, the transceiver path 316 can include a terminal of the antenna 124. In some example implementations, the switch 302 is implemented using a single-pole, double-throw switch, as shown in FIG. 4.

The steps described at 802 to 808 describe general operations of the test tone generator 132, the reference signal generator 130, and the switch 302 for performing aspects of built-in spur testing. Built-in spur testing can further include processes associated with spur measurement and/or spur-source diagnosis, which are further described with respect to FIGS. 9-11.

FIG. 9 describes an example process performed by the mode controller 134 for spur measurement. During this process, the mode controller 134 operates in accordance with the test mode 138. At 902, a frequency difference between a first phase-locked loop of a first reference signal generator and a second phase-locked loop of a second reference signal generator is selected. For example, the mode controller 134 selects a frequency difference between the phase-locked loop 502-1 of the reference signal generator 130-1 and the phase-locked loop 502-2 of the second reference signal generator 130-2, as shown in FIG. 6. In some examples, the selected frequency difference can be associated with an entry within a register template.

At 904, a frequency generated by the second phase-locked loop is tuned based on a frequency generated by the first phase-locked loop and the selected frequency difference. For example, the mode controller 134 tunes the frequency 516-2 generated by the phase-locked loop 502-2 based on the frequency 516-1 generated by the phase-locked loop 502-1 and the selected frequency difference.

At 906, a frequency generated by a test tone generator is tuned such that a first spurious signal can be measured at a frequency that is equal to a combination of a reference frequency generated by the second reference signal generator based on the frequency generated by the second phase-locked loop and an absolute value of the selected frequency difference. For example, the mode controller 134 tunes the frequency 716 generated by the test tone generator 132 such that a first spurious signal 222 can be measured at a spurious frequency 608 that is equal to a combination (e.g., summation or difference) of the reference frequency 314-2 generated by the second reference signal generator 130-2 based on the frequency generated by the second phase-locked loop and an absolute value of the selected frequency difference. As an example, the spur analyzer 136 or an external signal analyzer can measure a power level of the first spurious signal 222. In this case, the first spurious signal 222 represents a spurious signal generated due to the electromagnetic coupling 220-1 between the phase-locked loops 502-1 and 502-2.

At 908, the frequency generated by the test tone generator is tuned such that a second spurious signal can be measured at a frequency that is equal to a combination of the reference frequency generated by the second reference signal generator and an absolute value of a difference between the reference signal generated by the second reference signal generator and a reference signal generated by the first reference signal generator based on the frequency of the first phase-locked loop. For example, the mode controller 134 tunes the frequency 716 generated by the test tone generator 132 such that a second spurious signal 222 can be measured at a spurious frequency 608 that is equal to a combination (e.g., summation or difference) of the reference frequency 314-2 generated by the second reference signal generator 130-2 and an absolute value of a difference between the reference frequency 314-2 generated by the second reference signal generator 130-2 and the reference frequency 314-1 generated by the first reference signal generator 130-1 based on the frequency 516-1 generated by the phase-locked loop 502-1. In this case, the second spurious signal 222 represents a spurious signal generated due to the electromagnetic coupling 220-2 between the frequency-tuning circuits 504-1 and 504-2. In this example, the first reference signal generator 130-1 represents the aggressor 602, and the second reference signal generator 130-2 represents the victim 604, as shown in FIG. 6.

The process can be repeated at 902 using a different frequency difference. In some implementations, the mode controller 134 iterates through a list of entries specified within a register template. With this list, the mode controller 134 can quickly configure the test tone generator 132 and/or the reference signal generators 130, which enables the built-in spur testing to be performed faster than spur testing using the external signal generator.

FIG. 10 describes an example process performed by the mode controller 134 for spur-source diagnosis. During this process, the mode controller 134 operates in accordance with the diagnosis mode 140. At 1002, a frequency-tuning circuit of a first reference signal generator is deactivated. For example, the mode controller 134 deactivates the frequency-tuning circuit 504-1 of the reference signal generator 130-1 of FIG. 6. To deactivate the frequency-tuning circuit 504-1, the mode controller 134 can directly disable the frequency-tuning circuit 504-1 or cause the phase-locked loop 502-1 to be disconnected or decoupled from the frequency-tuning circuit 504-1.

At 1004, the first reference signal generator, a second reference signal generator, and a test tone generator are configured to enable measurement of a spurious signal. For example, the mode controller 134 configures the reference signal generator 130-1, the reference signal generator 130-2, and the test tone generator 132 to enable measurement of the spurious signal 222, as described with respect to FIG. 9.

With steps 1002 and 1004, the spur analyzer 136 or the external signal analyzer can determine if the frequency-tuning circuit 504-1 represents a dominate (or main) spur source 606. More specifically, the spur analyzer 136 can compare a power level of the spurious signal 222 generated at 1004 with a power level associated with a default spurious signal to determine if the frequency-tuning circuit 504-1 represents the dominate spur source 606.

At 1006, a voltage-controlled oscillator of the first reference signal generator is changed to a different voltage-controlled oscillator associated with a different oscillator type. For example, the mode controller 134 causes the voltage-controlled oscillator 508 of the reference signal generator 130-1 to be changed from a first type (e.g., an inductor-capacitor oscillator) to a second type (e.g., a ring oscillator).

At 1008, the first reference signal generator, the second reference signal generator, and the test tone generator are configured to enable measurement of the spurious signal. For example, the mode controller 134 configures the reference signal generator 130-1, the reference signal generator 130-2, and the test tone generator 132 to enable measurement of the spurious signal 222, as described with respect to FIG. 9.

With steps 1006 and 1008, the spur analyzer 136 or the external signal analyzer can determine if the spurious signal 222 is dominated by electromagnetic coupling through the first oscillator type. More specifically, the spur analyzer 136 can compare a power level of the spurious signal 222 generated at 1008 with a power level of a default spur to determine if the spurious signal 222 is dominated by the electromagnetic coupling.

FIG. 11 describes an example process performed by the mode controller 134 for spur-source diagnosis. During this process, the mode controller 134 operates in accordance with the diagnosis mode 140. At 1102, a first reference signal generator that is a first distance away from a second reference signal generator is activated. For example, the mode controller 134 activates the reference signal generator 130-1, which is a first distance away from the second reference signal generator 130-2.

At 1104, the first reference signal generator, the second reference signal generator, and a test tone generator are configured to enable measurement of a spurious signal. For example, the mode controller 134 configures the reference signal generator 130-1, the reference signal generator 130-2, and the test tone generator 132 to enable measurement of the spurious signal 222, as described with respect to FIG. 9.

At 1106, a third reference signal generator that is a second distance away from the second reference signal generator is activated. The second distance is different than the first distance. For example, the mode controller 134 activates the reference signal generator 130-N, which is a second distance away from the reference signal generator 130-2. The second distance differs from the first distance.

At 1108, the third reference signal generator, the second reference signal generator, and the test tone generator are configured to enable measurement of the spurious signal. For example, the mode controller 134 configures the reference signal generator 130-N, the reference signal generator 130-2, and the test tone generator 132 to enable measurement of the spurious signal 222, as described with respect to FIG. 9.

With steps 1102-1108, the spur analyzer 136 or the external signal analyzer can determine if an amplitude of the spurious signal 222 is dependent upon a distance between the victim reference signal generator 604 (e.g., reference signal generator 130-2) and the aggressor reference signal generator 602 (e.g., reference signal generators 130-1 or 130-N). If the amplitude of the spurious signal 222 varies between steps 1104 and 1108, this information can be included in the spur table 226 and enable the mode controller 134 to perform aspects of spur-dodging, as further described with respect to FIG. 12.

FIG. 12 describes an example process performed by the mode controller 134 for a mission mode. During this process, the mode controller 134 operates in accordance with the spur-dodging mode 142. At 1202, the integrated circuit 126 is configured for spur dodging. For example, the mode controller 134 configures the integrated circuit 126 for spur dodging. With this configuration, the mode controller 134 can attenuate one or more spurious signals 222 during the mission mode.

At 1204, selected reference signal generators are activated to cause a spurious signal to be attenuated based on a distance between the selected reference signal generators. For example, the mode controller 134 activates selected reference signal generators 130 that were previously determined to attenuate a spurious signal based on a distance between the selected reference signal generators 130.

At 1206, a frequency ratio of a reference signal generator is adjusted to change a spurious frequency. For example, the mode controller 134 changes a ratio between the frequencies 314 and 516 such that the spurious frequency 608 changes.

At 1208, a frequency response of a filter is adjusted to attenuate a spurious signal. For example, the mode controller 134 adjusts a frequency response of a filter that is implemented within the signal processing path 128 to attenuate the spurious signal 222.

During the mission mode, the mode controller 134 can perform the techniques described at 1204, 1206, 1208, or some combination thereof to attenuate the spurious signal 222 and improve the performance of the wireless transceiver 120.

Some aspects are described below.

Aspect 1: An apparatus comprising:

an integrated circuit comprising:
- a test tone generator comprising an amplitude control circuit;
- at least one reference signal generator; and
- at least one signal propagation path comprising:
  - a transceiver path configured to be coupled to an antenna;
  - a mixer having a first input coupled to the at least one reference signal generator; and
  - a switch configured to selectively connect a second input of the mixer to the transceiver path or the amplitude control circuit of the test tone generator.

Aspect 2: The apparatus of aspect 1, wherein the integrated circuit comprises a radio-frequency integrated circuit.

Aspect 3: The apparatus of aspect 2, wherein the radio-frequency integrated circuit comprises an amplifier coupled between the switch and the second input of the mixer.

Aspect 4: The apparatus of any previous aspect, wherein the switch is configured to selectively:

connect the transceiver path to the second input of the mixer and disconnect the amplitude control circuit from the second input of the mixer in accordance with a mission mode; and connect the test tone generator to the second input of the mixer and disconnect the transceiver path from the second input of the mixer in accordance with built-in spur testing.

Aspect 5: The apparatus of any previous aspect, wherein the at least one reference signal generator comprises:

a phase-locked loop; and a frequency-tuning circuit having:

an input coupled to an output of the phase-locked loop; and an output coupled to the mixer.

Aspect 6: The apparatus of aspect 5, wherein the frequency-tuning circuit comprises a frequency divider coupled between the phase-locked loop and the mixer.

Aspect 7: The apparatus of any previous aspect, wherein:

the at least one signal propagation path comprises multiple signal propagation paths;

the at least one reference signal generator comprises multiple reference signal generators respectively coupled to the mixers of the multiple signal propagation paths; and the multiple reference signal generators are configured to generate reference signals associated with different frequencies.

Aspect 8: The apparatus of aspect 7, wherein:

the apparatus comprises a receiver;

the receiver includes the multiple signal propagation paths; and the multiple signal propagation paths are associated with different receive channels of the receiver.

Aspect 9: The apparatus of aspect 8, wherein the receiver is configured to perform carrier aggregation using the different receive channels.

Aspect 10: The apparatus of any previous aspect, wherein the test tone generator comprises a phase-locked loop having an output coupled to an input of the amplitude control circuit.

Aspect 11: The apparatus of any previous aspect, wherein the amplitude control circuit comprises a voltage divider.

Aspect 12: An apparatus comprising:

an integrated circuit comprising:

means for generating a test signal;

means for generating a reference signal;

means for performing frequency conversion based on the reference signal;

means for propagating a signal provided by an antenna; and means for selectively connecting the means for performing frequency conversion to the means for propagating or to the means for generating the test signal.

Aspect 13: The apparatus of aspect 12, wherein the means for generating the test signal comprises means for adjusting an amplitude of the test signal.

Aspect 14: The apparatus of aspect 12 or 13, wherein the integrated circuit comprises means for controlling a frequency of the test signal for built-in spur testing.

Aspect 15: A method comprising:

generating a test signal using a test tone generator of an integrated circuit;

generating a reference signal using a reference signal generator of the integrated circuit;

connecting an input of a mixer of the integrated circuit to the test tone generator using a switch of the integrated circuit; and disconnecting the input of the mixer from a transceiver path using the switch, the transceiver path coupled to an antenna.

Aspect 16: The method of aspect 15, further comprising performing, based on a version of the test signal and the reference signal, frequency downconversion using the mixer.

Aspect 17: The method of aspect 15 or 16, further comprising:

generating a first reference signal using a first reference signal generator of the integrated circuit, wherein the generating the reference signal comprises generating a second reference signal using a second reference generator of the integrated circuit.

Aspect 18: The method of aspect 17, wherein the generating of the first reference signal causes a spurious signal to represent a portion of the second reference signal generated by the second reference signal generator.

Aspect 19: The method of aspect 18, further comprising:

measuring a power level of the spurious signal using a modem that is coupled to the integrated circuit.

Aspect 20: The method of any one of aspects 17 to 19, further comprising:

selecting a frequency difference between a first phase-locked loop of the first reference signal generator and a second phase-locked loop of the second reference signal generator;

tuning a frequency generated by the second phase-locked loop based on a frequency generated by the first phase-locked loop and the selected frequency difference; and tuning a frequency of the test signal such that a first spurious signal can be measured at a frequency that is equal to a combination of a second reference frequency of the second reference signal and an absolute value of the selected frequency difference.

Aspect 21: The method of aspect 20, further comprising:

tuning the frequency of the test signal such that a second spurious signal can be measured at a frequency that is equal to a combination of the second reference frequency and an absolute value of a difference between a first reference frequency of the first reference signal and the second reference frequency.

Aspect 22: The method of any one of aspects 15 to 21, further comprising configuring the integrated circuit to reduce a power level associated with a spurious signal associated with the generating of the reference signal.

Aspect 23: An apparatus comprising:

an integrated circuit comprising:

multiple reference signal generators configured to generate respective reference signals;

multiple signal propagation paths respectively configured to perform frequency-conversion operations based on the reference signals; and a test tone generator configured to inject a test signal into at least one of the multiple signal propagation paths.

Aspect 24: The apparatus of aspect 23, wherein:

the integrated circuit is configured to implement a portion of a receiver; and the multiple signal propagation paths are associated with different receive channels of the receiver.

Aspect 25: The apparatus of aspect 23 or 24, wherein the integrated circuit comprises a radio-frequency integrated circuit.

Aspect 26: The apparatus of any one of aspects 23 to 25, wherein at least two of the multiple reference signal generators are electromagnetically coupled, which causes at least one reference signal of the reference signals to be associated with a spurious frequency.

Aspect 27: The apparatus of aspect 26, wherein the integrated circuit comprises a mode controller configured to:

configure the multiple reference signal generators; and set a frequency and an amplitude of the test signal to enable a power level of the spurious frequency to be measured.

Aspect 28: The apparatus of any one of aspects 23 to 27, wherein:

the multiple reference signal generators each comprise a phase-locked loop and a frequency-tuning circuit; and the test tone generator comprises another phase-locked loop and an amplitude control circuit.

Aspect 29: The apparatus of aspect 28, wherein:

the phase-locked loops of the multiple reference signal generators respectively comprise inductor-capacitor oscillators; and the other phase-locked loop of the test tone generator comprises a ring oscillator.

Aspect 30: The apparatus of aspect 28 or 29, wherein the amplitude control circuit comprises a voltage divider comprising a first resistor having a variable resistance and a second resistor having a fixed resistance.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:

an integrated circuit comprising:

a test tone generator comprising an amplitude control circuit;

at least one reference signal generator; and at least one signal propagation path comprising:

a transceiver path configured to be coupled to an antenna;

a mixer having a first input coupled to the at least one reference signal generator; and a switch configured to selectively connect a second input of the mixer to the transceiver path or the amplitude control circuit of the test tone generator.

2. The apparatus of claim 1, wherein the integrated circuit comprises a radio-frequency integrated circuit.

3. The apparatus of claim 2, wherein the radio-frequency integrated circuit comprises an amplifier coupled between the switch and the second input of the mixer.

4. The apparatus of claim 1, wherein the switch is configured to selectively:

connect the transceiver path to the second input of the mixer and disconnect the amplitude control circuit from the second input of the mixer in accordance with a mission mode; and connect the test tone generator to the second input of the mixer and disconnect the transceiver path from the second input of the mixer in accordance with built-in spur testing.

5. The apparatus of claim 1, wherein the at least one reference signal generator comprises:

a phase-locked loop; and a frequency-tuning circuit having:

an input coupled to an output of the phase-locked loop; and an output coupled to the mixer.

6. The apparatus of claim 5, wherein the frequency-tuning circuit comprises a frequency divider coupled between the phase-locked loop and the mixer.

7. The apparatus of claim 1, wherein:

the at least one signal propagation path comprises multiple signal propagation paths;

the at least one reference signal generator comprises multiple reference signal generators respectively coupled to the mixers of the multiple signal propagation paths; and the multiple reference signal generators are configured to generate reference signals associated with different frequencies.

8. The apparatus of claim 7, wherein:

the apparatus comprises a receiver;

the receiver includes the multiple signal propagation paths; and the multiple signal propagation paths are associated with different receive channels of the receiver.

9. The apparatus of claim 8, wherein the receiver is configured to perform carrier aggregation using the different receive channels.

10. The apparatus of claim 1, wherein the test tone generator comprises a phase-locked loop having an output coupled to an input of the amplitude control circuit.

11. The apparatus of claim 1, wherein the amplitude control circuit comprises a voltage divider.

12. A method comprising:

generating a test signal using a test tone generator of an integrated circuit;

generating a reference signal using a reference signal generator of the integrated circuit;

connecting an input of a mixer of the integrated circuit to the test tone generator using a switch of the integrated circuit; and disconnecting the input of the mixer from a transceiver path using the switch, the transceiver path coupled to an antenna.

13. The method of claim 12, further comprising performing, based on a version of the test signal and the reference signal, frequency downconversion using the mixer.

14. The method of claim 12, further comprising:

generating a first reference signal using a first reference signal generator of the integrated circuit, wherein the generating the reference signal comprises generating a second reference signal using a second reference generator of the integrated circuit.

15. The method of claim 14, wherein the generating of the first reference signal causes a spurious signal to represent a portion of the second reference signal generated by the second reference signal generator.

16. The method of claim 15, further comprising:

measuring a power level of the spurious signal using a modem that is coupled to the integrated circuit.

17. The method of claim 14, further comprising:

selecting a frequency difference between a first phase-locked loop of the first reference signal generator and a second phase-locked loop of the second reference signal generator;

tuning a frequency generated by the second phase-locked loop based on a frequency generated by the first phase-locked loop and the selected frequency difference; and tuning a frequency of the test signal such that a first spurious signal can be measured at a frequency that is equal to a combination of a second reference frequency of the second reference signal and an absolute value of the selected frequency difference.

18. The method of claim 17, further comprising:

tuning the frequency of the test signal such that a second spurious signal can be measured at a frequency that is equal to a combination of the second reference frequency and an absolute value of a difference between a first reference frequency of the first reference signal and the second reference frequency.

19. The method of claim 12, further comprising configuring the integrated circuit to reduce a power level associated with a spurious signal associated with the generating of the reference signal.

* * * * *